(12) United States Patent
Oraw et al.

(10) Patent No.: US 9,074,758 B2
(45) Date of Patent: Jul. 7, 2015

(54) INTERLOCKING LIGHT SHEET TILES

(71) Applicant: Nthdegree Technologies Worldwide Inc., Tempe, AZ (US)

(72) Inventors: Bradley Steven Oraw, Chandler, AZ (US); Marc Oliver Meier, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/162,257

(22) Filed: Jan. 23, 2014

(65) Prior Publication Data

US 2014/0226329 A1  Aug. 14, 2014

Related U.S. Application Data

(60) Provisional application No. 61/763,295, filed on Feb. 11, 2013.

(51) Int. Cl.
| | |
|---|---|
| *H01R 33/00* | (2006.01) |
| *F21V 23/06* | (2006.01) |
| *F21K 99/00* | (2010.01) |
| *H01L 25/075* | (2006.01) |
| *F21V 21/005* | (2006.01) |
| *F21Y 101/02* | (2006.01) |

(52) U.S. Cl.
CPC . *F21V 23/06* (2013.01); *F21K 9/30* (2013.01); *F21K 9/56* (2013.01); *H01L 25/0753* (2013.01); *H01L 2924/0002* (2013.01); *F21V 21/005* (2013.01); *F21Y 2101/02* (2013.01)

(58) Field of Classification Search
CPC ......... F21V 21/005; F21V 23/06; F21K 9/30; F21K 9/56; F21Y 2101/02; H01L 25/0753; H01L 2924/0002
USPC ............. 362/217.12–217.13, 217.16–217.17, 362/249.02, 646–647, 800
See application file for complete search history.

(56) References Cited

U.S. PATENT DOCUMENTS

| | | |
|---|---|---|
| 2005/0178034 A1 | 8/2005 | Schubert et al. |
| 2005/0248935 A1 | 11/2005 | Strip et al. |
| 2010/0142198 A1 | 6/2010 | Yang |
| 2012/0164796 A1 | 6/2012 | Lowenthal et al. |

OTHER PUBLICATIONS

PCT/US2014/013508 International Search Report and Written Opinion, Apr. 15, 2014, 10 pages.

*Primary Examiner* — Jason Moon Han
(74) *Attorney, Agent, or Firm* — Patent Law Group LLP; Brian D. Ogonowsky

(57) ABSTRACT

A system of interlocking LED panel tiles includes a first tile having at least one layer of light emitting diodes (LEDs) provided on a substrate, where the substrate is mounted on a substantially rectangular supporting plate having interlocking features. The substrate overlaps the interlocking features. The first tile has a set of positive and negative voltage conductors running between the two sets of opposite edges of the tile as busses. Multiple identical tiles are provided. Each tile has the interlocking features along their edges that firmly physically connect to abutting tiles to create a lamp having any pattern of tiles selected by the user. By interlocking the tiles, the positive and negative conductors are automatically connected to electrically connect the LEDs in the tiles in parallel, and the interlocking features are hidden by the overlying substrate. Additional conductors may be used to provide greater interconnection flexibility.

19 Claims, 4 Drawing Sheets

INTERLOCKING LIGHT SHEET TILES

CROSS-REFERENCE TO RELATED APPLICATIONS

This application is based on U.S. provisional application Ser. No. 61/763,295, filed Feb. 11, 2013, by Bradley Steven Oraw and Marc Oliver Meier, assigned to the present assignee and incorporated herein by reference.

FIELD OF THE INVENTION

This invention relates to forming a light emitting diode (LED) lamp and, in particular, to forming a large area lamp using interlocking light sheet tiles.

BACKGROUND

LED lamps greatly reduce operating cost compared to incandescent lamps, are more pleasing than fluorescent lamps, and have a very long life.

Flat light panels for overhead lighting using LEDs are known. High power LEDs are typically optically coupled to the edge of a light guide, and the light guide has a roughened surface for light emission. The LED light is reflected internally until it leaks out the roughened surface. Light panels are also known which comprise a two-dimensional array of bare LEDs sandwiched between two conductor layers and supported on a substrate, where the LED light directly exits the surface of the light panel opposite to the substrate. Typically, for both types of light panels, if more than one light panel is needed, such as for overhead lighting of a room, each light panel is independently supported and independently connected to a power supply.

Drawbacks with the above designs include: 1) separately supporting each light panel adds cost and weight; 2) the support structures are required to be aesthetically pleasing for a wide variety of applications; 3) the support structures take up space and create dark areas between the light panels; 4) the independently supported light panels must be carefully aligned by the installer; and 5) the installer of the light panels must determine how to install the light panels with the correct voltage polarity.

What is needed is a wide area LED light system, such as for overhead lighting, that does not suffer from the above-described drawbacks.

SUMMARY

In one embodiment, a light sheet is formed by printing an array of microscopic LED dies over a first conductor layer supported by a substrate. The bottom electrodes (e.g., cathode electrode) of the LED dies ohmically contact the first conductor layer. A transparent conductor layer is deposited over the top electrodes (e.g., anode electrodes) of the LED dies to ohmically contact the top electrodes. Metal bus bars are formed on the first and second conductor layers and are connected to anode and cathode leads on the bottom of the light sheet. The light sheet emits light from its top surface when the LED dies are turned on.

Each light sheet is a non-square rectangle having a size of, for example, 1×1.5 feet. Any size rectangle may be used. For purposes of this disclosure, the term "rectangle" is limited to a non-square. Each light sheet may be on the order of 1 mm thick and will typically be very flexible. In one embodiment, the bare LED dies emit blue light, and a phosphor over the light sheet or on each LED die causes the resulting light to be white light for illuminating a room.

A single light sheet is then mounted on a light weight, but rigid or semi-rigid, bottom plate approximately the same size as the light sheet. The bottom plate includes a first set of positive and negative polarity conductors running between opposite first edges of the bottom plate, and includes a second set of positive and negative polarity conductors running between opposite second edges of the bottom plate. The positive polarity conductors are shorted together, and the negative polarity conductors are shorted together. The anode and cathode leads on the bottom of the light sheet are respectively connected to the positive and negative polarity conductors on the bottom plate.

The bottom plate has two tabs (keys) extending from each of two adjacent edges and has two indented locks along the two other edges, opposite to the keys. One positive polarity conductor is located in one key on each of the two edges, and one negative polarity conductor is located in the other key on each of the two edges. Similarly, one positive polarity conductor is located in one lock on each of the two remaining edges, and one negative polarity conductor is located in the other lock on each of the two edges.

A plurality of identical tiles is provided, where each tile comprises a light sheet and a bottom plate. A semi-rigid, light-passing top plate may be optionally mounted over the light sheet to protect the light sheet and add mechanical support. The bottom plates may be interconnected as rectangular puzzle pieces to both firmly affix one tile (in perfect alignment) to another while electrically connecting the various positive polarity keys and locks and negative polarity keys and locks to the corresponding keys and locks of adjacent tiles. The tiles may be interconnected linearly or two-dimensionally. The tiles may be connected in any pattern, such as an L-shape.

Due to the keys and locks, there is no possibility of incorrect polarity connections, the tiles are perfectly aligned with each other, there is no noticeable dark area gap between the tiles, and the support structure is very light weight, inexpensive, and not seen.

Each light sheet may be constructed to have any electrical characteristics by connecting the LED dies in any combination of series and parallel, and the interconnected tiles are connected in parallel.

The tiles may be made flexible so the interconnected tiles can follow the contours of a curved wall or corner.

A special connector connects to the key and lock on one edge of an end tile in the resulting arrangement for connection to a power supply. Since the tiles are connected in parallel and have substantially identical voltage drops, each additional tile draws additional current from the power supply and each tile emits the same brightness irrespective of the number of tiles connected, assuming the power supply can supply the required current.

Many variations of the above embodiment are contemplated.

BRIEF DESCRIPTION OF THE DRAWINGS

FIG. 3 is taken along line 3-3 in FIG. 4.

Elements that are similar or identical in the various figures are labeled with the same numeral.

DETAILED DESCRIPTION

In one embodiment of the invention, a thin, rectangular light sheet containing LED dies is mounted on a bottom plate having interlocking features and electrical connection features. The combination forms a single tile. Any number of tiles are then connected together, like a puzzle, without a gap to form any size and shape lamp. One end of the lamp includes a connector for a power supply. FIGS. 1-4 illustrate various types of suitable light sheets, but the examples are not intended to be limiting.

Figure 1:
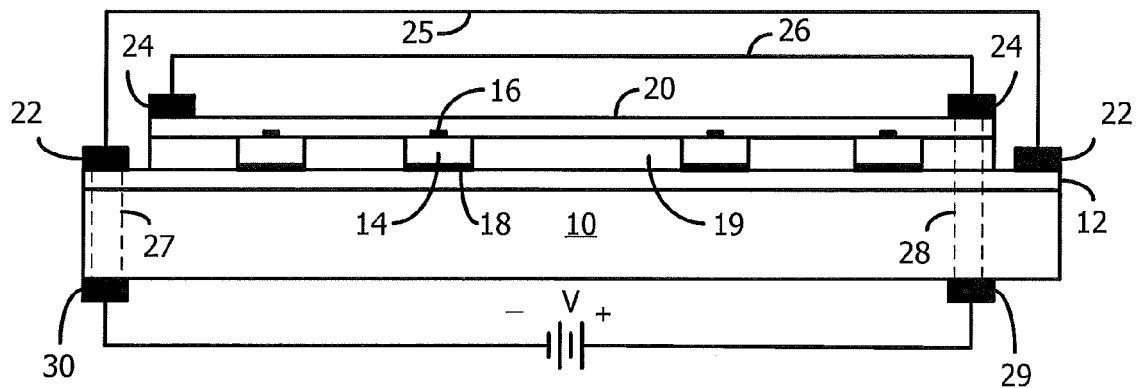
FIG. 1 is a simplified cross-section of a light sheet with an array of vertical LEDs sandwiched between two conductor layers to connect the LEDs in parallel, in accordance with one embodiment of the invention.

In FIG. 1, a starting substrate 10 may be Mylar or other type of polymer sheet, or even a metal sheet. A conductor layer 12 is then deposited over the substrate 10, such as by printing. The substrate 10 and/or conductor layer 12 is preferably reflective. A reflective film, including a white diffusing paint, may also be provided on the front or back surface of the substrate 10.

The LEDs 14 are initially completely formed on a wafer, including the anode and cathode metallizations, by using one or more carrier wafers during the processing and removing the growth substrate to gain access to both LED surfaces for metallization. The top surface of the LEDs 14 may be roughened by etching to increase light extraction (i.e., decrease internal reflections). After the LEDs are formed on the wafer, trenches are photolithographically defined and etched in the front surface of the wafer around each LED, to a depth equal to the bottom electrode, so that each LED has a diameter of about 30 microns and a thickness of about 6 microns. A preferred shape of each LED is hexagonal. The back surface of the wafer is then thinned until the LEDs are singulated. The LEDs 14 of FIG. 1 result. The microscopic LEDs 14 are then uniformly infused in a solvent, which includes a viscosity-modifying polymer resin, to form an LED ink for printing, such as screen printing.

The LED ink is screen printed over the conductor layer 12. The orientation of the LEDs can be controlled by providing a relatively tall top electrode 16 (e.g., the anode electrode), so that the top electrode 16 orients upward by taking the fluid path of least resistance through the solvent after printing. The anode and cathode surfaces may be opposite to those shown. The LED ink is heated (cured) to evaporate the solvent. After curing, the LEDs remain attached to the underlying conductor layer 12 with a small amount of residual resin that was dissolved in the LED ink as a viscosity modifier. The adhesive properties of the resin and the decrease in volume of resin underneath the LEDs 14 during curing press the bottom cathode electrode 18 against the underlying conductor layer 12, creating a good ohmic connection. Over 90% like orientation has been achieved, although satisfactory performance may be achieved with over 75% of the LEDs being in the same orientation.

A dielectric layer 19 is then selectively printed over the lamp surface to encapsulate the LEDs 14 and secure them in position. The ink used in the dielectric layer 19 is designed to pull back from the upper surface of the LED 14 during curing to expose the top anode electrodes 16.

A transparent conductor layer 20 is then printed to contact the top electrodes 16. The conductor layer 20 may be ITO or may include silver nanowires. The conductor layer 20 is cured by lamps to create good ohmic contact to the electrodes 16.

Metal bus bars 22 and 24 are then printed and cured to electrically contact the conductor layers 12 and 20 along their edges. The metal bus bars along opposite edges are shorted together by a printed metal portion (represented by wires 25 and 26) outside of the cross-section. The structure may have one or more conductive vias 27 and 28 (metal filled through-holes), which form a bottom anode lead 29 and a bottom cathode lead 30. Instead of vias, the top metal may be connected to the bottom metal by other means, such as metal straps extending over the edges of the light sheet. A suitable voltage differential applied to the leads 29 and 30 turns on the LEDs 14 to emit light through the top surface of the light sheet. Although the microscopic LEDs 14 are randomly distributed, they are fairly uniformly distributed over the area of the flat sheet due to the large number of LEDs printed. There may be millions of LEDs 14 printed on the substrate 10. The fabrication process may be performed under atmospheric conditions.

The LEDs 14 in the monolayer, within a defined area, are connected in parallel by the conductor layers 12/20 since the LEDs 14 have the same orientation. If the LEDs 14 are connected in parallel, the driving voltage must approximately equal the voltage drop of a single LED 14 and the current is relatively high.

Further detail of forming a light source by printing microscopic vertical LEDs, and controlling their orientation on a substrate, can be found in US application publication US 2012/0164796, entitled, Method of Manufacturing a Printable Composition of Liquid or Gel Suspension of Diodes, assigned to the present assignee and incorporated herein by reference.

Many other ways can be used to form the LEDs 14, and the LEDs 14 do not need to be microscopic or printed for the present invention to apply.

Figure 2:
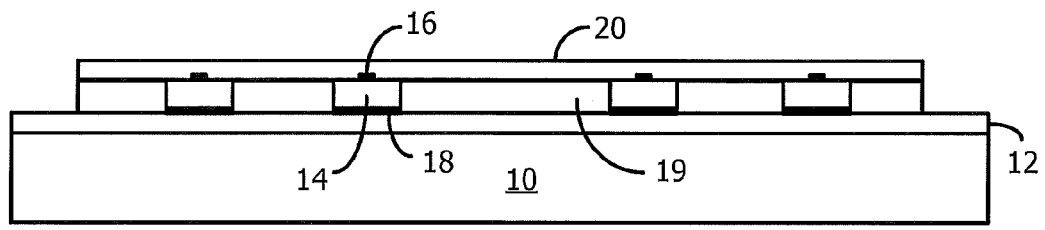
FIG. 2 is a simplified cross-section of a light sheet in accordance with another embodiment of the invention during fabrication to create a light sheet with LED dies connected in series.
Figure 3:
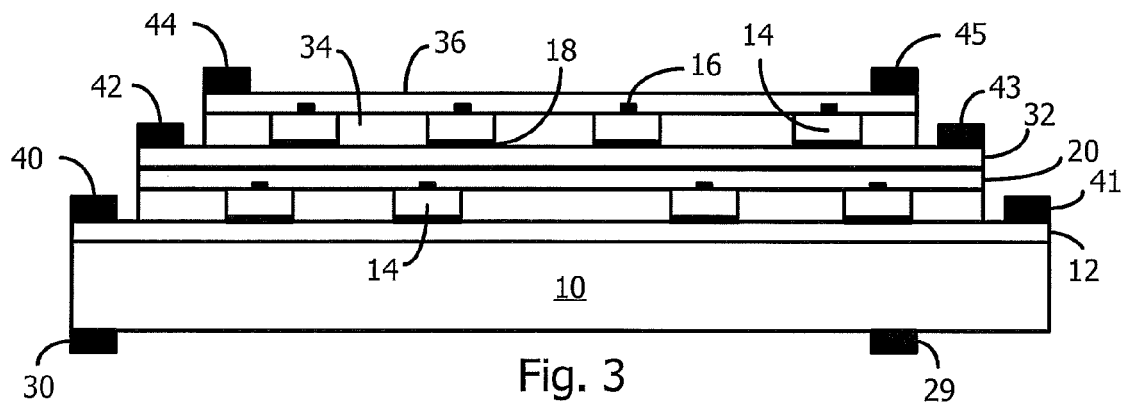
FIG. 3 illustrates the light sheet of FIG. 2 after additional fabrication steps to form two layers of LEDs in series.
Figure 4:
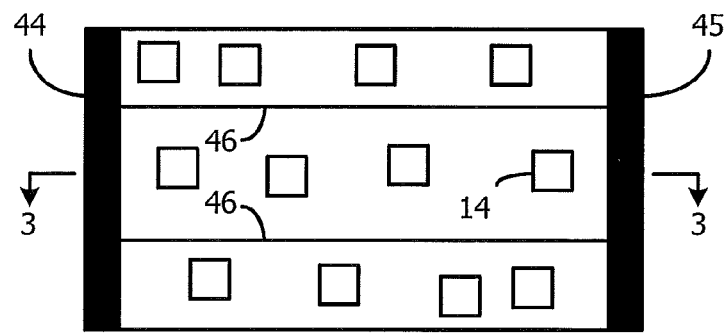
FIG. 4 is a top down view of only the top layer of LEDs in FIG. 3, where

FIG. 2-4 illustrate the formation of a light sheet that comprises printed LEDs connected in series by printing overlapping layers of LEDs to reduce the current through the conductor layers and increase the density of LEDs to increase the brightness-to-area ratio.

The first layer of LEDs 14, shown in FIG. 2, may be identical to that shown in FIG. 1.

As shown in FIG. 3, another transparent conductor layer 32 is printed over the conductor layer 20.

The LED ink is then again printed over the conductor layer 32 to form a second layer of LEDs 14, which may be identical to the LEDs 14 in the first layer or different. In one embodiment, all the LEDs 14 are the same and emit blue light. A phosphor layer (e.g., a yellow YAG phosphor) may be deposited over the top of the light sheet or on the LEDs 14 to cause the light sheet to emit white light or any other color.

In another embodiment, the conductor layers 20 and 32 are formed as a single layer, and the conductor layers 20 and 32 are cured in a single step to make ohmic contact to the electrodes in the first and second layers of LEDs 14.

The following steps may be identical to those described with respect to FIG. 2. The LED ink solvent is then evaporated by heat, such as using lamps, which causes the bottom cathode electrodes 18 to form an ohmic connection to the conductor layer 32.

A transparent dielectric layer 34 is then printed over the entire surface to encapsulate the LEDs 14 and further secure them in position. The top anode electrodes 16 are exposed through the dielectric layer 34.

A transparent conductor layer 36 is then printed over the dielectric layer 34 to electrically contact the electrodes 16. The conductor layer 36 may be ITO or may include silver nanowires. The conductor layer 36 is cured to create good ohmic contact to the electrodes 16.

The LEDs 14 in each layer are thus connected in parallel, and the two layers of LEDs 14 are connected in series. Additional overlapping layers of LEDs 14 may be printed to add more LEDs in series.

The various layers are printed so that edge areas of the conductor layers 12, 32, and 36 are exposed.

Metal bus bars 40-45 are then screen printed along opposite edges of the conductor layers 12, 32, and 36 for connection to one or more voltage/current sources. The bus bars 42 and 43 are optional if a voltage is to be only coupled to the bottom and top conductor layers. If the bus bar ink is solvent based, it may be cured in an oven. If it is a radiation cured silver, it may be cured by exposing it to a UV light or electron beam curing system. The bus bars will ultimately be connected to a voltage differential for turning on the LEDs 14. The points of connection between the bus bars and the driving voltage leads should be at least on two ends of each bus bar to more uniformly distribute current along the bus bars. The bus bars on opposite edges of a conductor layer are shorted together, either by the printed metal or an external connection.

Metal vias are formed through the light sheet, contacting at least the bus bars 40 and 45, to form a bottom anode lead 29 and a bottom cathode lead 30. Over-the-edge metal straps may also be used.

FIG. 4 is a top down view of the structure of FIG. 3, where FIG. 3 is taken along line 3-3 in FIG. 4. Only the second layer of LEDs 14 is illustrated for simplicity. The LEDs 14 in the first layer would also be visible in a top down view, since the various layers are transparent and the LEDs 14 in the layers would be offset due to their random positions in the layers.

If the light sheet is wide, there will be a significant IR drop across at least the transparent conductor layer 36. Thin metal runners 46 may be printed along the surface of the conductor layer 36 between the two bus bars 44 and 45 to cause the conductor layer 36 to have a more uniform voltage, resulting in more uniform current spreading.

The resulting structure may be less than 1 mm thick or thicker if greater rigidity is desired.

When a suitable voltage is applied, the current flows vertically through each of the LEDs 14 in the first layer, then flows both vertically and slightly laterally through the conductor layers 20 and 32 until conducted by an LED 14 in the second layer of LEDs 14. Since the various layers are very thin and transparent, and the conductor layer 12 or the substrate 10 is reflective, there is little light absorption. There is also less IR loss since the current supplied to the conductor layers 12 and 36 is one-half that supplied to the conductor layers 12 and 20 in FIG. 1.

Since the two layers of LEDs 14 in FIG. 3 have twice the density as the single layer of LEDs 14 in FIG. 1, the brightness-to-area ratio is doubled. Since the LEDs 14 are extremely small and randomly positioned (not vertically aligned), the LEDs 14 in the second layer will typically not directly overlie the LEDs 14 in the first layer. Hence, a majority of light exiting the LEDs in the first layer is not blocked by the LEDs in the second layer. Further, since the bottom electrodes 18 of the LEDs are reflective, any impinging light is reflected and ultimately exits the light sheet. The relative size of the LEDs 14 in FIG. 3 is greatly exaggerated, and the spacings of the LEDs 14 are greatly compressed for ease of illustration.

The GaN-based micro-LEDs used in embodiments of the present invention have a width less than a third the diameter of a human hair, rendering them essentially invisible to the naked eye when the LEDs are sparsely spread across a substrate to be illuminated. The number of micro-LED devices per unit area may be freely adjusted when applying the micro-LEDs to the substrate. A well dispersed random distribution across the surface can produce nearly any desirable surface brightness. Lamps well in excess of 10,000 cd/m$^2$ have been demonstrated by the assignee.

In all the embodiments, a single light sheet may be formed by multiple areas of LEDs on a single substrate, where each separate area of LEDs comprises LEDs electrically connected in parallel and/or series by the various conductor layers. As an example, one strip of LEDs may be physically separated from an adjacent strip as a result of the pattern used during the screen printing of the LEDs and conductor layers. In this way, the separate strips may be connected together in series and/or parallel, or isolated, by metal patterns on the light sheet to achieve the desired electrical characteristics of the light sheet. Dividing the LEDs into areas and connecting them in certain configurations also reduces the required current for each conductor layer and improves reliability in the event of a short or open circuit. Each strip may be a centimeter wide or less and contain thousands of LEDs. The different strips may contain different types of LEDs (having different forward voltages) so the different colors from the strips are combined. In one embodiment, red, green, and blue LEDs are in adjacent narrow strips to create white light without a phosphor.

A single light sheet may be any size rectangle, such as 1×1.5 feet or smaller or larger. Each of the figures may represent a single strip or area in a larger light sheet or may represent the entire light sheet. The various metal bus bars may be interconnected in any manner.

Since all the layers may be printed and cured using lamps, the light sheet may be manufactured using a conveyor system at atmospheric pressures.

Figure 5:
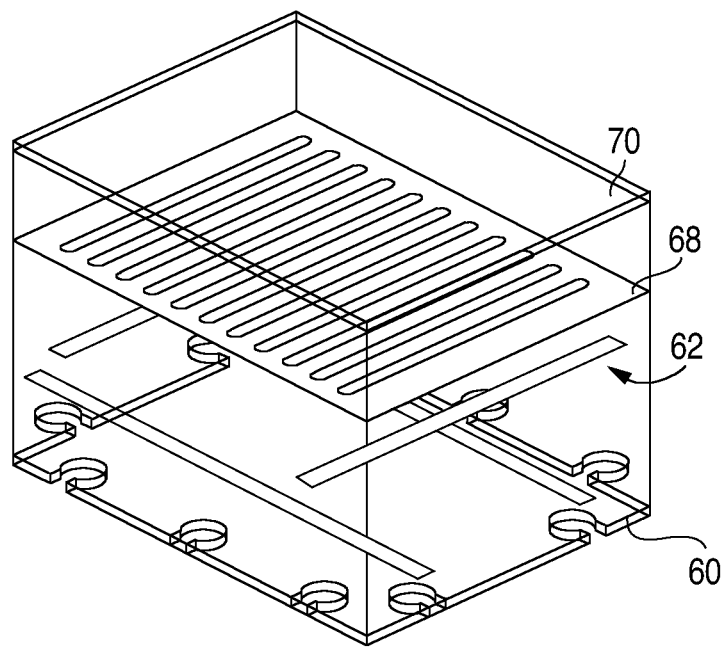
FIG. 5 is an exploded perspective view of a bottom plate, positive and negative polarity conductors, a light sheet, and a top plate.

FIG. 5 is an exploded perspective view of a bottom plate 60, positive and negative polarity conductors 62, a light sheet 68 (which may include any of the light sheets described above), and an optional top plate 70 for protection of the light sheet 68 and/or for providing desired optical properties, such as diffusion, directionality, etc. The resulting rectangular structure forms a lightweight tile that may be physically and electrically connected to other identical tiles without tools and without worry of improper polarity connections.

Figure 6:
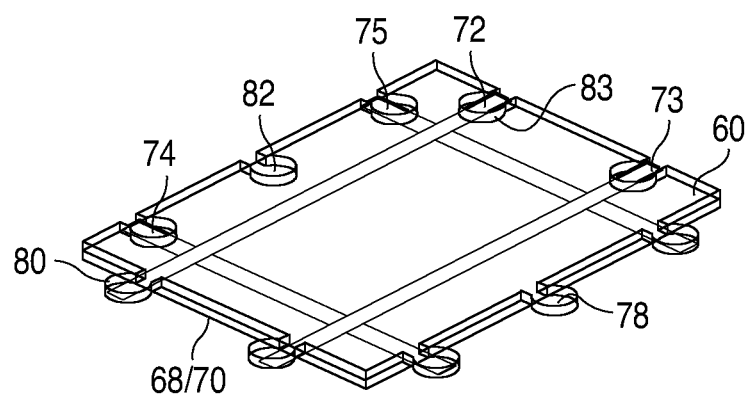
FIG. 6 is a perspective view of the bottom surface of the bottom plate, which is shown transparent to illustrate conductors on the opposite side of the bottom plate.

FIG. 6 is a perspective view of the bottom surface of the bottom plate 60 of a tile, which is shown transparent to illustrate the conductors on the top surface of the bottom plate 60. The bottom plate 60 may be any lightweight material and can be opaque or transparent. In one embodiment, the bottom plate 60 may be on the order of about 1 cm thick, depending on the surface area of the tile, to make the tile at least semi-rigid and able to achieve a strong mechanical interlocking with an adjacent tile. A suitable material for the bottom plate 60 may be molded plastic, which is a dielectric. The plastic may have holes molded in it for reducing its weight.

On the top surface of the plate 60 facing the light sheet 68 are two sets of conductors, which may be metal tape, patterned metal traces, or a printed circuit board. The conductors include a first positive conductor 72, a first negative conductor 73, a second positive conductor 74, and a second negative conductor 75. The positive conductors 72 and 74 are shorted together at their cross-over point, and the negative conductors 73 and 75 are shorted together at their cross-over point. The remaining two cross-over points have a dielectric material between the conductors 72 and 75 and between the conductors 73 and 74.

The plate 60 is molded to have three keys 78 (tabs) along one long edge, two keys 80 along one short edge, three locks 82 (indentations) along the other long edge, and two locks 83 along the other short edge. There may be more or fewer locks and keys along the edges. The keys of one tile perfectly fit into the locks of an adjacent tile so the tiles are rigidly coupled together after being joined, like puzzle pieces. The pitch of the locks and keys are selected such that only the keys on a short side of one tile can fit in the locks on the short side of another tile, and only the keys on a long side of one tile can fit in the locks on the long side of another tile.

The conductors 72-75 are positioned to extend between opposite key-lock pairs to act as buses between connected tiles and also electrically contact the bottom anode and cathode leads 29/30 of the light sheet 68. The conductors 72-75 may overlap edges of the bottom plate 60 to ensure a good electrical connection to corresponding conductors in an attached tile. When the tiles are connected together, the corresponding conductors push tightly against one another.

The keys and locks may be circular (as shown), rectangular, triangular, or any other shape.

Figure 7:
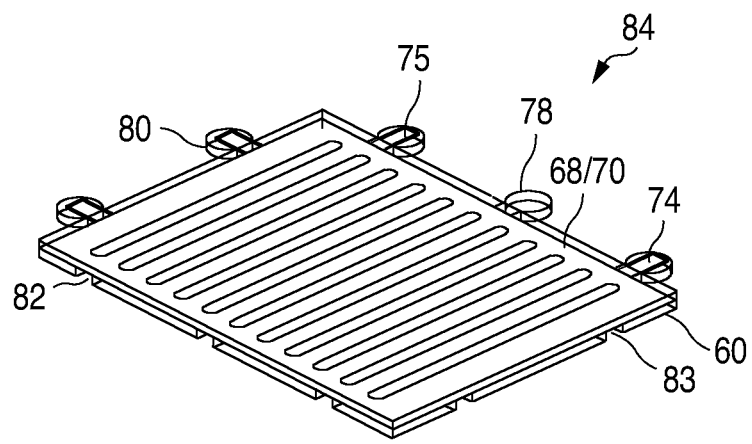
FIG. 7 is a perspective view of a light sheet and top plate mounted on the bottom plate to form a tile.

FIG. 7 is a perspective view of a light sheet 68 mounted on the top surface of the bottom plate 60, and the top plate 70 affixed over the light sheet 68, to form a tile 84. A conductive grease may be applied to the abutting surfaces of the bottom anode lead 29 (FIG. 1 or 3) of the light sheet 68 and the positive conductor 74 (FIG. 6), and between the bottom cathode lead 30 of the light sheet 68 and the negative conductor 75, to ensure good electrical contact over a wide area. The light sheet 68 may be affixed in place with any type of adhesive and uniform pressure.

Figure 8:
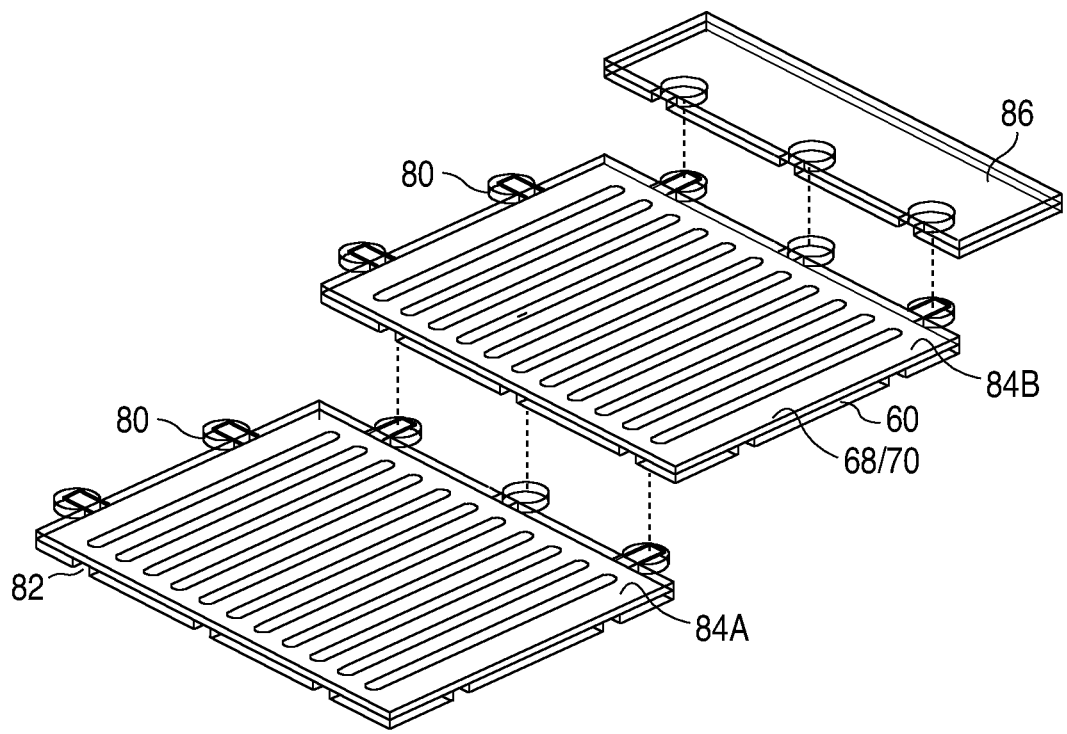
FIG. 8 illustrates how the tiles of FIG. 7 are interconnected with each other and also illustrates how an end piece is connected to an end tile for aesthetic purposes. Similar edge pieces may be connected to the edges of the other tiles.

FIG. 8 illustrates how the tiles 84A and 84B (identical to the tile 84 of FIG. 7) are interconnected with each other and also illustrates how an end piece 86, having locks, is connected to the end tile 84B for aesthetic purposes. The end piece 86 is formed of the same material as the bottom plate 60 and may be transparent or opaque. Other end pieces are provided with keys for the other sides of the tiles. Shorter edge pieces (not shown) may be connected to the edges of the other tiles to make the edges straight for aesthetic reasons. In one embodiment, longer lengths of end and edge pieces, spanning multiple tiles, are provided to add rigidity to the interconnected tiles.

The combined light sheets and top plates 68/70 act as a hard stop when the keys of one tile are pushed into the locks of another tile, so there is perfect alignment of tiles.

No tools or adhesive is needed for assembling a lamp from the interconnected tiles 84. The keys fit tightly into the locks so the tiles 84 remain aligned and affixed to each other while handling by the installer. The walls of the keys and locks may be slightly angled to create a very tight fit when pressed together.

Figure 9:
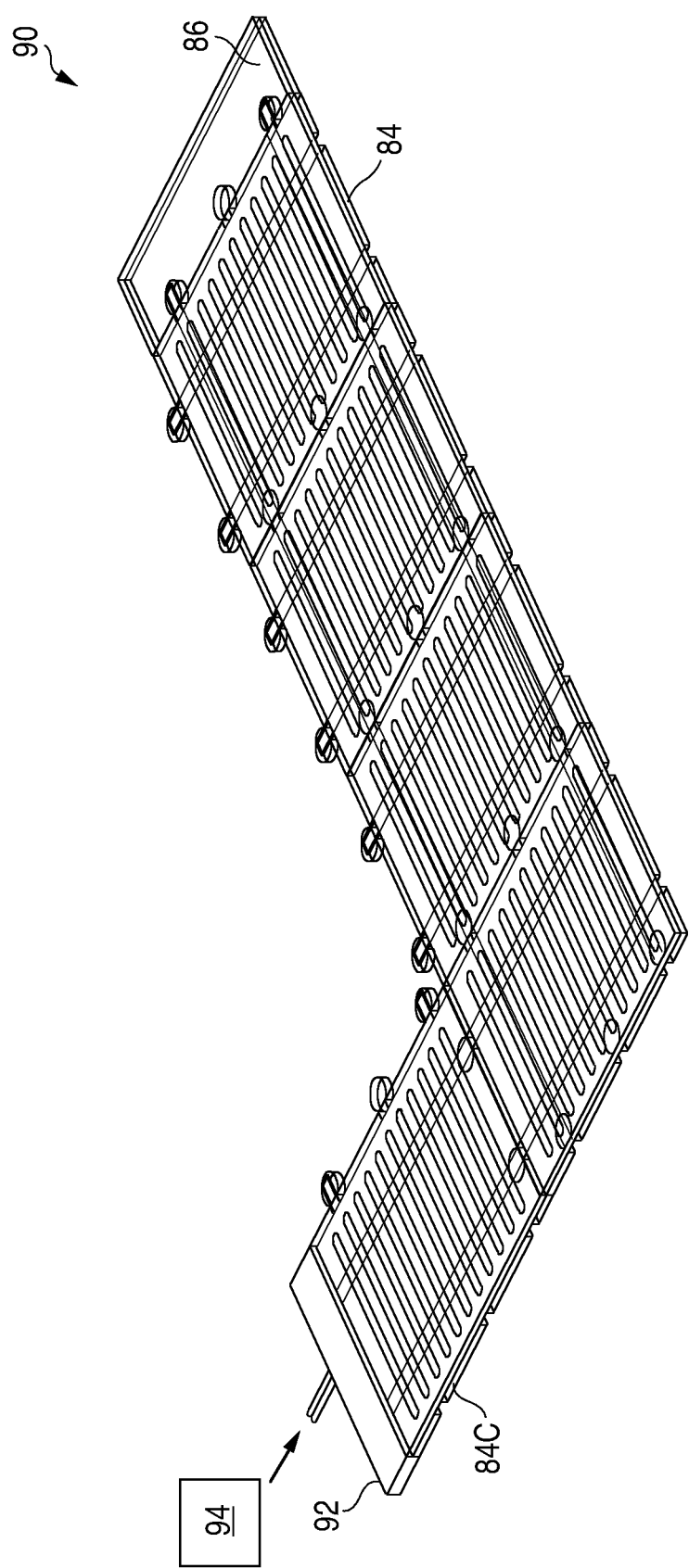
FIG. 9 illustrates a lamp structure comprising the tiles forming an L-shape.

FIG. 9 illustrates a lamp 90 comprising the interconnected tiles 84 forming an L-shape to fit a non-rectangular spot. The lamp 90 may be suspended from a ceiling using a simple frame and hangers or even screws.

FIG. 9 illustrates how the end tile 84C has its positive and negative conductors terminated with a connector piece 92 (having keys and locks corresponding to an edge of the end tile 84C). The connector piece 92 may have a plug or socket for receiving a voltage differential for turning on all the LEDs in the lamp 90. All the tiles 84 use the same driving voltage, and adding more tiles 84 increases the current drawn from the power supply 94.

The top plate 70 is not needed if the light sheet 68 itself is sufficient for mechanical stability, etc.

All layers of the tile 84 can be made flexible so that the lamp can be mounted on a curved wall, including corners, and contour to its surface.

To achieve desirable electrical characteristics, such as to reduce currents, the light sheets 68 may include any number of LEDs connected in series. In another embodiment, there are two types of well-identified tiles 84, where the anode and cathode leads are reversed. This allows the LEDs in adjacent tiles to be connected in any combination of series and parallel by the installer.

In another embodiment, there are more than two conductors per tile, which are connected to corresponding conductors in other tiles and terminate at a plug or socket. These conductors may be connected to different areas, or different types, or different colors of LEDs in a tile so that the driving voltage may be independently controlled for each group of LEDs for color control or pattern control. The conductors may also be externally interconnected to connect LEDs in any combination of series and parallel. Further, there may be many more conductors per tile which allow areas of LEDs to be addressed as pixels or color channels. A lock and key may have multiple associated conductors rather than one. Further, additional conductors may be provided on the bottom or top surface of the bottom panel 60 that can serve to further control the LEDs, such as providing x-y addressing of LEDs as pixels, or even increase the current carrying capability of each tile in the event many tiles are connected together.

Instead of strips, the positive and negative voltage conductors may be wide conductor planes, spanning the entire width and length of a tile and insulated from each other.

The positive and negative voltage conductors need not be formed along the surface of the bottom plate 60 but may run along the top or bottom surface of the LED sheet and connected to just the edges of the bottom plate 60 for electrical connected between an abutting tile.

Electrical and mechanical contacts can be in separate edge features and not limited to the same feature.

Tessellating tile shapes other than rectangles are envisioned.

3D connections (e.g., for vertical stacking) on the tiles are also possible for a 3-D lamp structure.

A resulting lamp may be used for general overhead lighting, or under-cabinet lighting, or task lighting, or a backlight for an LCD, or a display, etc.

Tiles 84 may be provided in different sizes for different applications.

The light sheets 68 may be any type of flat light panel or sheet containing LEDs, and the LEDs do not have to be printed.

In one embodiment, the bottom plate 60 is the substrate 10 (FIG. 1) on which the LEDs 14 are printed or otherwise mounted on. Accordingly, each tile 68 can be a single integral piece rather than the three piece construction shown in FIG. 5. The term "plate" can thus refer to the LED mounting substrate or a separate plate affixed to the substrate.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure comprising:
    a first tile comprising:
        at least one layer of light emitting diodes (LEDs) provided on a top surface of a first substrate;
        a substantially rectangular supporting plate, the supporting plate having a first edge, a second edge opposite the first edge, a third edge, and a fourth edge opposite the third edge, wherein a bottom surface of the first substrate is affixed to a top surface of the supporting plate;
        a positive voltage conductor running between the first edge and the second edge and between the third edge and the fourth edge;
        a negative voltage conductor running between the first edge and the second edge and between the third edge and the fourth edge;
        first edge features along the first edge and the third edge, the first edge features having a protruding neck portion and an expanded portion connected to the first tile by the neck portion, the first edge features including at least a first electrical contact electrically coupled to at least one of the positive voltage conductor and the negative voltage conductor;
        second edge features along the second edge and the fourth edge, the second edge features having an indented neck portion and an expanded indented portion, the second edge features including at least a second electrical contact electrically coupled to at least one of the positive voltage conductor and the negative voltage conductor,
        wherein edges of the first substrate overlie the second edge features along the second edge and the fourth edge;
    a second tile identical to the first tile,
    wherein the first edge features of the first tile interlock with the second edge features of the second tile to secure the first tile to the second tile when the first tile and the second tile are abutting,
    wherein the edges of the first substrate cover the interlocked first edge features and the second edges features after the first tile is interlocked with the second tile,
    wherein interlocking the first tile to the second tile causes the positive voltage conductor of the first tile to contact the positive voltage conductor of the second tile, and causes the negative voltage conductor of the first tile to contact the negative voltage conductor of the second tile such that at least some of the LEDs in the first tile are electrically connected to at least some of the LEDs in the second tile upon the first tile being interlocked to the second tile.

2. The structure of claim 1 further comprising:
    the at least one layer of LEDs having been printed on the top surface of the first substrate using an LED ink; and
    the at least one layer of LEDs having conductive first surface electrodes connected to conductive second surface electrodes, the second surface electrodes electrically contacting the positive voltage conductor and the negative voltage conductor on the supporting plate.

3. The structure of claim 2 wherein the positive voltage conductor and the negative voltage conductor are flat conductors formed on a top side of the supporting plate, wherein the flat conductors are sandwiched between the substrate and the supporting plate and contact the second surface electrodes.

4. The structure of claim 1 wherein the positive voltage conductor and the negative voltage conductor form flat strips across the supporting plate.

5. The structure of claim 1,
    wherein the positive voltage conductor terminates in some of the first edge features and some of the second features of the first tile and the second tile, and
    wherein the negative voltage conductor terminates in others of the first features and others of the second edge features of the first tile and the second tile,
    such that interlocking the first tile to the second tile causes the positive voltage conductor in one first feature of the first tile to contact the positive voltage conductor in one second feature of the second tile, and causes the negative voltage conductor in another first feature of the first tile to contact the negative voltage conductor in another second feature of the second tile.

6. The structure of claim 1 wherein the first edge features comprise tabs extending from the supporting plate, and wherein the second edge features comprise indentations in the supporting plate.

7. The structure of claim 1,
    wherein the supporting plate is rectangular, wherein the first edge and the second edge are longer than the third edge and the fourth edge, and
    wherein a pitch of the first features along first edge is different from a pitch of the first features along the third edge, such that only the first edge of the first tile can be interlocked to the second edge of the second tile, and only the second edge of the first tile can be interlocked to the first edge of the second tile, such that only edges of identical lengths can be interlocked.

8. The structure of claim 1 wherein the LEDs in the first tile are electrically connected in parallel to the LEDs in the second tile upon the first tile being interlocked to the second tile.

9. The structure of claim 1 wherein the LEDs in the first tile are electrically connected in series to the LEDs in the second tile upon the first tile being interlocked to the second tile.

10. The structure of claim 1 further comprising additional tiles identical to the first tile and the second tile, wherein the first tile, the second tile, and the additional tiles are interconnected in a two-dimensional pattern.

11. The structure of claim 10 wherein the supporting plate and the at least one layer of LEDs are flexible to allow the two-dimensional pattern to contour to a curved mounting surface.

12. The structure of claim 10 wherein the two-dimensional pattern comprises an overhead lamp for general illumination.

13. The structure of claim 1 further comprising a wavelength conversion layer for converting light from the LEDs into white light.

14. The structure of claim 1 wherein the at least one layer of LEDs comprises LEDs mounted in strips on a substrate, wherein the LEDs in a single strip are connected in parallel, and the LEDs in two or more different strips are connected in series.

15. The structure of claim 1 wherein the positive voltage connector and the negative voltage connector run along a surface of the supporting plate.

16. The structure of claim 1 wherein the indented second edge features along the second edge and fourth edge of the supporting plate are entirely covered by the first substrate, such that when the first tile and the second tile are interlocked, an edge of the first substrate of the first tile and an edge of the first substrate of the second tile oppose one another, and the first substrate of the first tile overlies the interlocked first edge features and second edge features.

17. The structure of claim 16 wherein the edge of the first substrate of the first tile and the edge of the first substrate of the second tile abut to obscure the interlocked first edge features and second edge features.

18. A lighting method using a plurality of identical tiles containing light emitting diodes (LEDs), the plurality of tiles including a first tile comprising at least one layer of LEDs provided on a top surface of a first substrate, a substantially rectangular supporting plate, the supporting plate having a first edge, a second edge opposite the first edge, a third edge, and a fourth edge opposite the third edge, wherein a bottom surface of the first substrate is affixed to a top surface of the supporting plate, a positive voltage conductor running between the first edge and the second edge and between the third edge and the fourth edge, a negative voltage conductor running between the first edge and the second edge and between the third edge and the fourth edge, first edge features along the first edge and the third edge, the first edge features having a protruding neck portion and an expanded portion connected to the first tile by the neck portion, the first edge features including at least a first electrical contact electrically coupled to at least one of the positive voltage conductor and the negative voltage conductor, and second edge features along the second edge and the fourth edge, the second edge features having an indented neck portion and an expanded indented portion, the second edge features including at least a second electrical contact electrically coupled to at least one of the positive voltage conductor and the negative voltage conductor, wherein edges of the first substrate overlie the second edge features along the second edge and the fourth edge, the plurality of tiles also including a second tile identical to the first tile, the method comprising:

interlocking the first edge features of the first tile with the second edge features of the second tile to secure the first tile to the second tile when the first tile and the second tile are abutting, wherein interlocking the first tile to the second tile causes the positive voltage conductor of the first tile to contact the positive voltage conductor of the second tile, and causes the negative voltage conductor of the first tile to contact the negative voltage conductor of the second tile such that at least some of the LEDs in the first tile are electrically connected to at least some of the LEDs in the second tile upon the first tile being interlocked to the second tile, wherein the indented second edge features along the second edge and fourth edge of the supporting plate are entirely covered by the first substrate, such that when the first tile and the second tile are interlocked, an edge of the first substrate of the first tile and an edge of the first substrate of the second tile oppose one another, and the first substrate of the first tile overlies the interlocked first edge features and second edge features.

19. The method of claim 18 wherein the first edge features comprise tabs extending from the supporting plate, and wherein the second edge features comprise indentations in the supporting plate.

* * * * *